United States Patent
Kamigaki et al.

(10) Patent No.: US 9,922,991 B2
(45) Date of Patent: Mar. 20, 2018

(54) SEMICONDUCTOR MEMORY DEVICE AND METHOD FOR MANUFACTURING SAME

(71) Applicant: Toshiba Memory Corporation, Minato-ku (JP)

(72) Inventors: Tetsuya Kamigaki, Yokkaichi (JP); Isahiro Hasegawa, Nerima (JP); Shinichi Ito, Yokohama (JP); Soichi Inoue, Yokohama (JP); Tatsuhiko Higashiki, Fujisawa (JP); Kei Hattori, Kuwana (JP); Koichi Matsuno, Mie (JP); Seiji Morita, Shinagawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/267,623

(22) Filed: Sep. 16, 2016

(65) Prior Publication Data

US 2017/0271363 A1    Sep. 21, 2017

Related U.S. Application Data

(60) Provisional application No. 62/309,245, filed on Mar. 16, 2016.

(51) Int. Cl.
*H01L 27/115*   (2017.01)
*H01L 27/11582*   (2017.01)
(Continued)

(52) U.S. Cl.
CPC ...... *H01L 27/11582* (2013.01); *H01L 21/288* (2013.01); *H01L 21/76816* (2013.01);
(Continued)

(58) Field of Classification Search
None
See application file for complete search history.

(56) References Cited

U.S. PATENT DOCUMENTS 8,183,624 B2   5/2012 Mizukami et al.
8,207,565 B2*  6/2012 Sato ............... H01L 27/0207
                                                 257/296
(Continued)

FOREIGN PATENT DOCUMENTS

JP   2008-263029   10/2008
JP   2014-56981    3/2014
(Continued)

OTHER PUBLICATIONS

Jiyoung Kim et al. "Novel 3-D Structure for Ultra High Density Flash Memory with VRAT (Vertical-Recess-Array-Transistor) and PIPE (Planarized Integration on the same PlanE)", 2008 Symposium on VLSI Technology Digest of Technical Papers, IEEE, 2008, 2 pages.

*Primary Examiner* — Andres Munoz
(74) *Attorney, Agent, or Firm* — Oblon, McClelland, Maier & Neustadt, L.L.P.

(57) ABSTRACT

A semiconductor memory device includes a stacked body including a first electrode layer and a second electrode layer stacked on the first electrode layer, and first and second interconnections on a first surface of the stacked body. The first and second electrode layers have first and second end surfaces respectively in the first surface. The first interconnection is electrically connected to the first electrode layer through a first region of the first end surface; and the second interconnection is electrically connected to the second electrode layer through a second region of the second end surface. The first and second interconnections extend in a first direction on the first surface. The first and second regions are arranged in a second direction crossing the first direction with a crossing angle smaller than 90 degrees. The first region and the second region each have a boundary along the second direction.

13 Claims, 13 Drawing Sheets

(51) Int. Cl.
*H01L 23/528* (2006.01)
*H01L 27/11556* (2017.01)
*H01L 21/288* (2006.01)
*H01L 21/768* (2006.01)

(52) U.S. Cl.
CPC .. *H01L 21/76877* (2013.01); *H01L 21/76895* (2013.01); *H01L 21/76897* (2013.01); *H01L 23/528* (2013.01); *H01L 27/11556* (2013.01)

(56) References Cited

U.S. PATENT DOCUMENTS

| | | | | |
|---|---|---|---|---|
| 8,278,695 | B2* | 10/2012 | Kidoh | H01L 21/8221 257/314 |
| 8,338,956 | B2* | 12/2012 | Maeda | H01L 27/11573 257/773 |
| 8,497,533 | B2* | 7/2013 | Hyun | H01L 27/11551 257/260 |
| 9,029,266 | B2 | 5/2015 | Kasahara et al. | |
| 9,073,284 | B2 | 7/2015 | Hieno et al. | |
| 9,455,268 | B2* | 9/2016 | Oh | H01L 27/2481 |
| 2008/0099819 | A1* | 5/2008 | Kito | G11C 16/10 257/315 |
| 2008/0253183 | A1* | 10/2008 | Mizukami | H01L 27/105 365/185.05 |
| 2009/0146190 | A1* | 6/2009 | Fukuzumi | H01L 27/11578 257/204 |
| 2009/0230449 | A1* | 9/2009 | Sakaguchi | H01L 27/0688 257/298 |
| 2009/0230462 | A1* | 9/2009 | Tanaka | H01L 27/11578 257/326 |
| 2011/0092038 | A1* | 4/2011 | Choi | H01L 27/11526 438/268 |
| 2011/0147818 | A1* | 6/2011 | Katsumata | H01L 27/11573 257/314 |
| 2011/0204420 | A1* | 8/2011 | Kim | H01L 27/0688 257/211 |
| 2012/0119287 | A1* | 5/2012 | Park | H01L 27/11519 257/329 |
| 2013/0020647 | A1* | 1/2013 | Hwang | H01L 27/11565 257/365 |
| 2013/0032875 | A1* | 2/2013 | Yun | H01L 29/66833 257/324 |

FOREIGN PATENT DOCUMENTS

| | | |
|---|---|---|
| JP | 2014-135435 | 7/2014 |
| JP | 5694109 | 4/2015 |

* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/309,245 filed on Mar. 16, 2016; the entire contents of which are incorporated herein by reference.

FIELD

Embodiments are generally related to a semiconductor memory device and a method for manufacturing the same.

BACKGROUND

A NAND type semiconductor memory device, which comprises three-dimensionally arranged memory cells, includes a plurality of word lines stacked and a semiconductor channel body extending therethrough. The memory cells provided along the semiconductor channel body are driven by the word lines respectively. Although the stacked word lines need to be electrically connected to interconnections respectively, the connection structure thereof may be complicated in such a semiconductor memory device. Thus, there is a demand for a simple structure capable of connecting the stacked word lines to the interconnections respectively.

DETAILED DESCRIPTION

Figure 1:
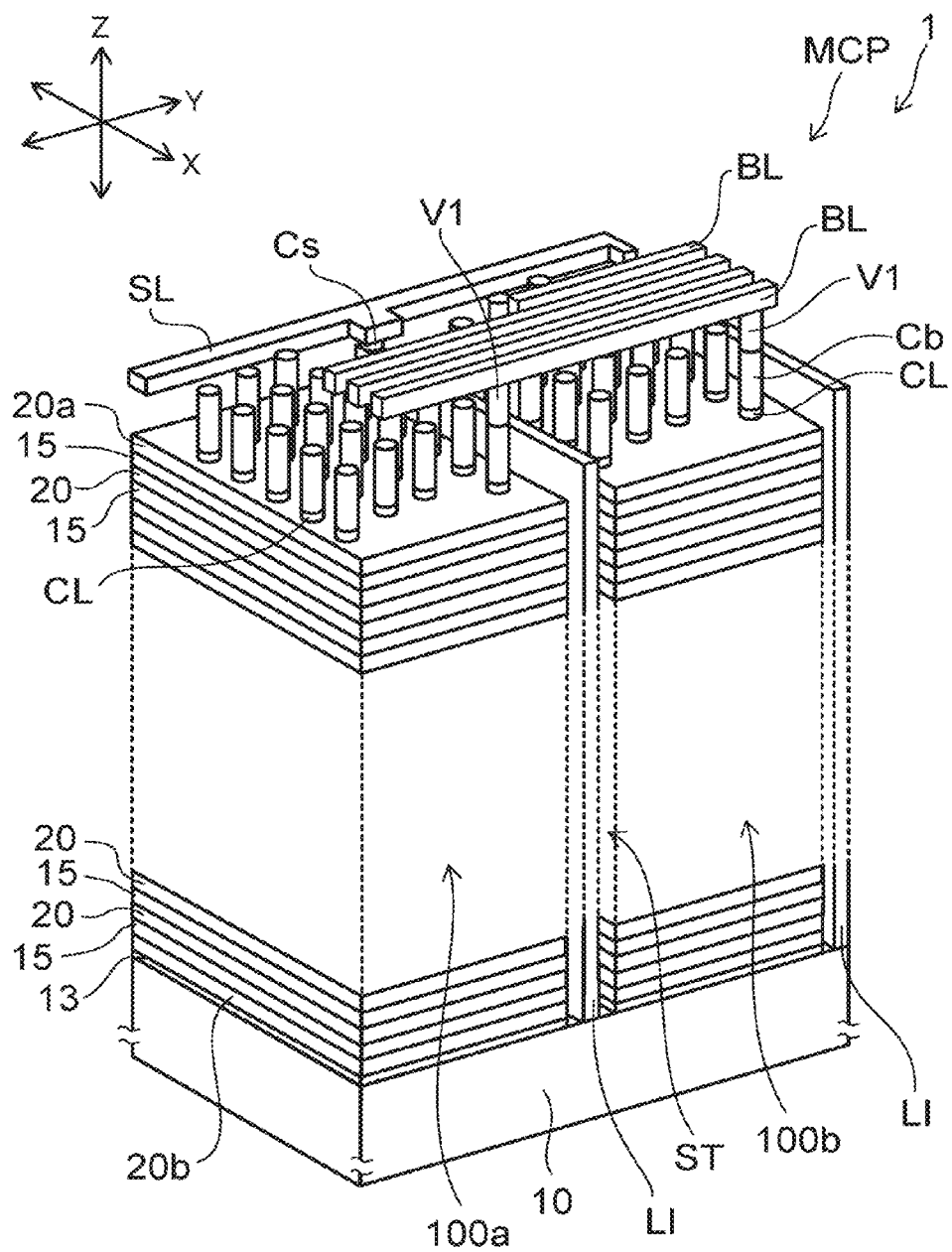
FIG. 1 is a perspective view schematically showing a memory cell portion of a semiconductor memory device according to a first embodiment.

According to one embodiment, a semiconductor memory device includes a stacked body including a first electrode layer and a second electrode layer stacked on the first electrode layer. The stacked body has a first surface crossing a stacked direction toward the second electrode layer from the first electrode layer. The first electrode layer has a first end surface in the first surface, and the second electrode layer has a second end surface in the first surface. The device further includes a semiconductor layer extending through the stacked body in the stacked direction; a first interconnection electrically connected to the first electrode layer through a first region provided in the first end surface; and a second interconnection electrically connected to the second electrode layer through a second region provided in the second end surface. The first and second interconnections extend in a first direction. The first region and the second region are arranged in the second direction crossing the first direction with a crossing angle smaller than 90 degrees. The first region and the second region each have a boundary along the second direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated. There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a memory cell portion MCP of a semiconductor memory device 1 according to a first embodiment. The semiconductor memory device 1 is, for example, a NAND type non-volatile memory device, which includes three-dimensionally arranged memory cells As shown in FIG. 1, the semiconductor memory device 1 includes a conductive layer (hereinafter, source layer 10), a stacked body 100a, and a stacked body 100b. The stacked bodies 100a and 100b are arranged in the Y-direction on the source layer 10. The stacked bodies 100a and 100b each include a plurality of electrode layers 20 and a plurality of insulating layers 15 stacked on the source layer 10 via an insulating layer 13 interposed. The electrode layers 20 and the insulating layers 15 are arranged alternately in the stacked direction of the electrode layers 20. The insulating layer 15 electrically insulates the adjacent electrode layers 20 in the Z-direction from each other.

The source layer 10 is, for example, a P-type well provided in a silicon substrate (not shown). The source layer 10 may be a silicon layer provided on a silicon substrate via an interlayer insulating layer (not shown). The electrode layer 20 is, for example, a metal layer containing tungsten (W). The insulating layer 15 is, for example, a silicon oxide layer.

The stacked bodies 100a and 100b each include a plurality of columnar bodies CL (see FIGS. 2A and 2B) extending in the Z-direction through the electrode layers 20 and the insulating layers 15. Each columnar body CL is electrically connected to a bit line BL through contact plugs Cb and V1. The bit line BL extends, for example, in the Y-direction above the stacked bodies 100a and 100b. One columnar body CL in the stacked body 100a shares one bit line BL with one columnar body CL in the stacked body 100b. For convenience in showing the structure of the semiconductor memory device 1, the insulating layers 43 and 45 (see FIG.

2A) provided between the bit line BL and the uppermost electrode layer 20a of electrode layers 20 are omitted in FIG. 1.

The semiconductor memory device 1 further includes a source contact body LI electrically connected to the source layer 10, and a source line SL. The source contact body LI is provided in a slit ST between the stacked body 100a and the stacked body 100b. The source contact body LI is, for example, a plate-like metal body extending in the X-direction and the Z-direction. The source contact body LI is electrically connected to the source line SL through a contact plug Cs. That is, the source line SL is electrically connected to the source layer 10 through the source contact body LI. The source line SL extends, for example, in the Y-direction above the stacked bodies 100a and 100b.

Figure 2A:
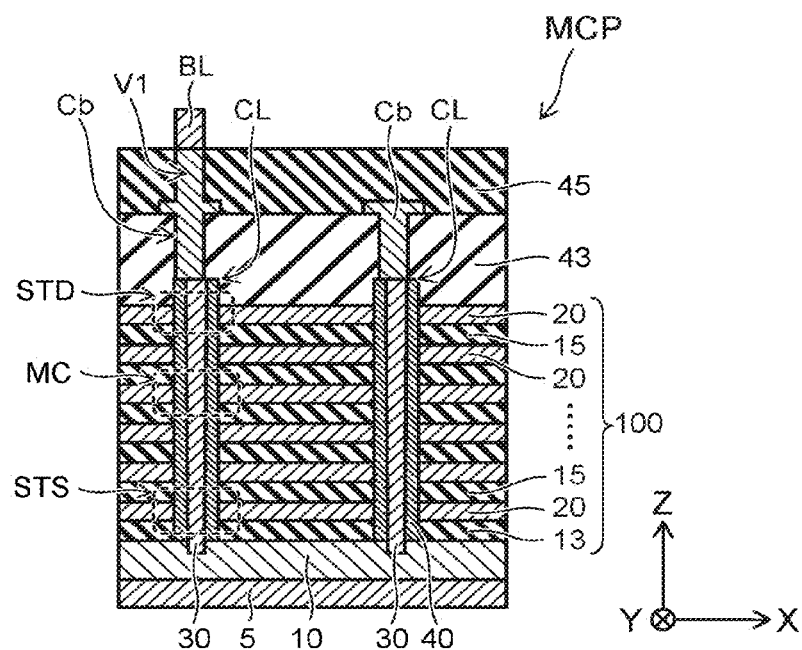
FIGS. 2A and 2B are schematic cross-sectional views showing the semiconductor memory device according to the first embodiment.
Figure 2B:
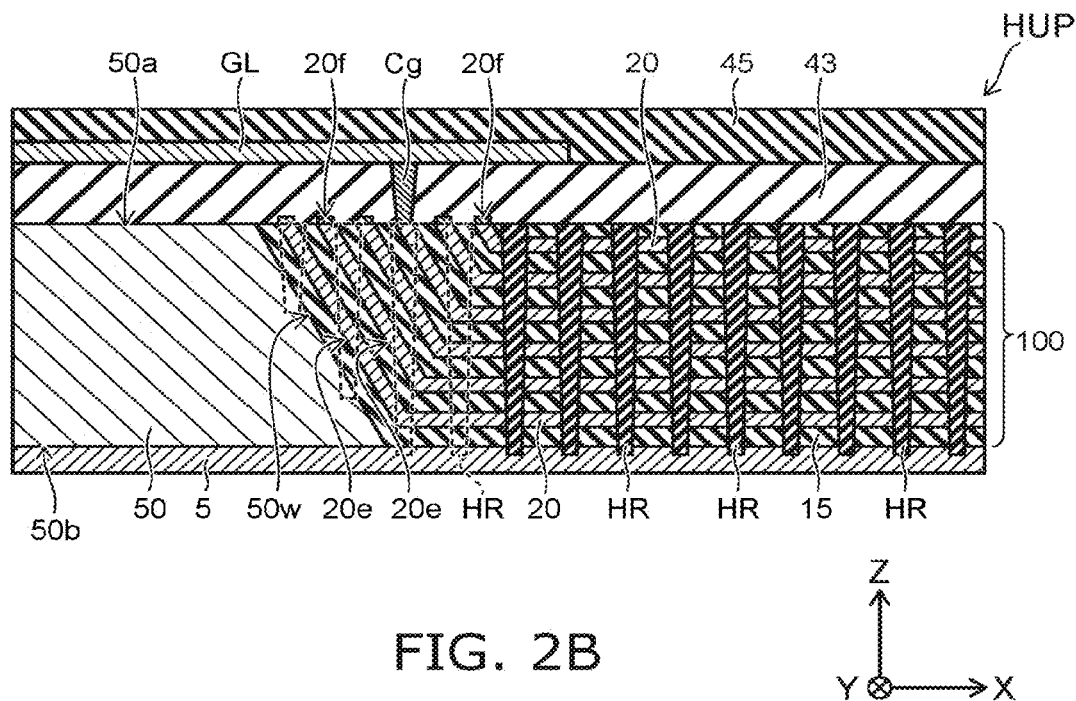

FIGS. 2A and 2B are schematic cross-sectional views showing the semiconductor memory device 1 according to the first embodiment. The semiconductor memory device 1 includes, for example, a memory cell portion MCP and a hook-up portion HUP. The memory cell portion MCP includes three-dimensionally arranged memory cells MC. The hook-up portion HUP has a hook-up structure for electrically connecting the electrode layers 20 stacked in the Z-direction to gate interconnections GL respectively. FIG. 2A is a schematic view showing a cross section of the memory cell portion MCP taken along the X-Z plane. FIG. 2B is a schematic view showing a cross section of the hook-up portion HUP taken along the X-Z plane. Hereinafter, the structure of the semiconductor memory device 1 is described in detail with reference to FIGS. 2A and 2B. In the following description, the stacked body 100a and the stacked body 100b are referred to as stacked body 100 without distinction.

As shown in FIG. 2A, the memory cell portion MCP is provided on the source layer 10. The source layer 10 is provided on the upper surface side of a substrate 5. The substrate 5 is e.g. a silicon substrate. The memory cell portion MCP is provided with a plurality of columnar bodies CL extending through the electrode layers 20 and the insulating layers 15 in the Z-direction. Each columnar body CL includes a semiconductor layer 30 and an insulating layer 40.

The semiconductor layer 30 is e.g. a silicon layer and extends in the Z-direction inside the columnar body CL. The semiconductor layer 30 is electrically connected to the source layer 10 at the lower end thereof. The semiconductor layer 30 is electrically connected to the bit line BL through the contact plugs Cb and V1 at the upper end thereof. The insulating layer 40 is located between the electrode layer 20 and the semiconductor layer 30, and extends in the Z-direction along the semiconductor layer 30.

A source side selection transistor STS, memory cells MC, and a drain side selection transistor STD are provided respectively in the portions where the columnar body CL extending through the electrode layers 20. The selection transistor STS is provided, for example, at the portion where the columnar body CL extends through the lowermost electrode layer 20b. The selection transistor STD is provided, for example, at the portion where the columnar body CL extends through the uppermost electrode layer 20a. The memory cells MC are provided at the portions where the columnar body CL extends through the electrode layers 20 between the select transistor STS and the select transistor STD. Thus, the semiconductor memory device 1 includes the memory cells MC and the selection transistors STS and STD arranged along the columnar body CL extending in the Z-direction.

The semiconductor layer 30 acts as the channel bodies of the memory cells MC and the selection transistors STD and STS. The electrode layer 20a acts as a selection gate of the selection transistor STD. The electrode layer 20b acts as the selection gate of the selection transistor STS. The electrode layers 20 located between the electrode layer 20a and the electrode layer 20b act as the control gates of the memory cells MC respectively.

The insulating layer 40 has, for example, an ONO structure in which silicon oxide, silicon nitride and silicon oxide are sequentially stacked in a direction from an electrode layer 20 toward the semiconductor layer 30. The insulating layer 40 includes a part that acts as a charge retention part of memory cell MC, the part being positioned between the electrode layer 20 and the semiconductor layer 30. The insulating layer 40 may include a conductive body (not shown) serving as a floating gate between the electrode layer 20 and the semiconductor layer 30.

In the following section, the structure of the hook-up portion HUP is described with reference to FIG. 2B. The hook-up portion HUP is provided in an end part of the stacked body 100 that includes the memory cell portion MCP. As shown in FIG. 2B, the hook-up portion HUP includes end parts 20e of the electrode layers 20. Furthermore, the hook-up portion HUP includes a plurality of columnar support bodies HR. Each columnar support body HR extends through the electrode layers 20 and the insulating layers 15 in the Z-direction.

As shown in FIG. 2B, in the hook-up portion HUP, a support body 50 is provided on the substrate 5. The support body 50 is, for example, a silicon layer. The support body 50 has an upper surface 50a, a lower surface 50b and a sidewall 50w inclined toward the Z-direction with respect to the surface of the substrate 5. An insulating layer, not shown, may be provided between the lower surface 50b of the support body 50 and the substrate 5.

The support body 50 is positioned between the substrate 5 and the end parts 20e of the electrode layers 20. The support body 50 has a portion including the sidewall 50w. The end part 20e of each electrode layer 20 inclines along the sidewall 50w. Furthermore, each electrode layer 20 has an end surface 20f facing in the Z-direction. That is, as described later, each electrode layer 20 has an end surface 20f exposed in the upper surface 100f of the stacked body 100 (see FIG. 4E). The end surface 20f extends, for example, in the Y-direction in the upper surface 100f of the stacked body 100 (see FIG. 5A).

The gate interconnection GL is provided, for example, on the insulating layer 43 that covers the upper surface 100f of the stacked body 100 and the upper surface 50a of the support body 50. The gate interconnection GL is electrically connected to an electrode layer 20 through a contact plug Cg provided on the end surface 20f thereof. The gate interconnection GL electrically connects the electrode layer 20 to a row decoder, for example.

Figure 3:
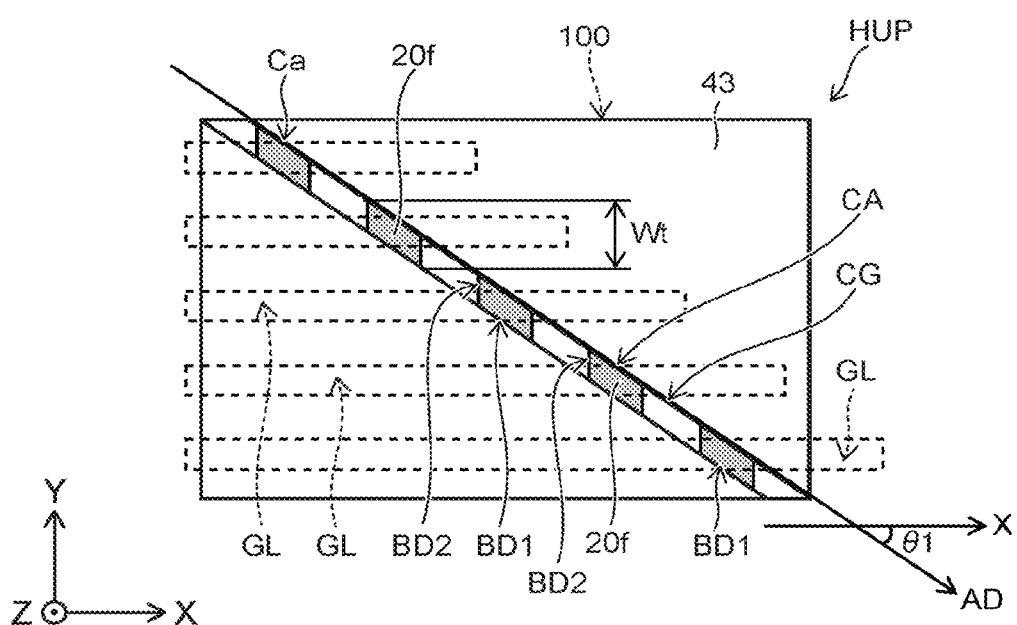
FIG. 3 is a plan view schematically showing a hook-up portion of the semiconductor memory device according to the first embodiment.

FIG. 3 is a schematic view showing a contact groove CG provided in the insulating layer 43 in the hook-up portion HUP. The contact groove CG is provided, for example, to extend in an AD-direction crossing the X-direction and the Y-direction on the upper surface 100f of the stacked body 100. The AD-direction crosses the X-direction, for example, with a crossing angle θ of 90 degrees or less.

The contact groove CG is formed such that parts of the end surfaces 20f are exposed at the bottom surface thereof. the part of end surface 20f exposed at the bottom surface of the contact groove CG serves as a contact area CA of each electrode layer 20.

As shown in FIG. 3, the contact areas CA are arranged in the AD-direction. The contact area CA has a boundary BD1 along the AD-direction and a boundary BD2 along the extending direction of the end surface 20f (Y-direction). That is, the contact area CA is a parallelogram area.

The gate interconnection GL extends in the X-direction on the insulating layer 43. The gate interconnection GL is provided so as to be positioned above each contact area CA. The contact area CA is provided with the parallelogram shape extending obliquely with respect to the extending direction of the gate interconnection GL. Thus, it is possible to enlarge the tolerance Wt for the gate interconnection GL crossing the contact area CA. That is, a large tolerance Wt for absorbing the positional variation of the contact area CA described later is ensured.

In the following descriptions, a method for manufacturing the semiconductor memory device 1 is explained with reference to FIGS. 4A to 4F and FIGS. 5A to 5H. FIGS. 4A to 5H are schematic sectional views showing the process for manufacturing the semiconductor memory device 1 according to the embodiment. FIGS. 4A to 4F and FIGS. 5B to 5H are schematic views showing a cross section of the hook-up portion HUP.

Figure 4A:
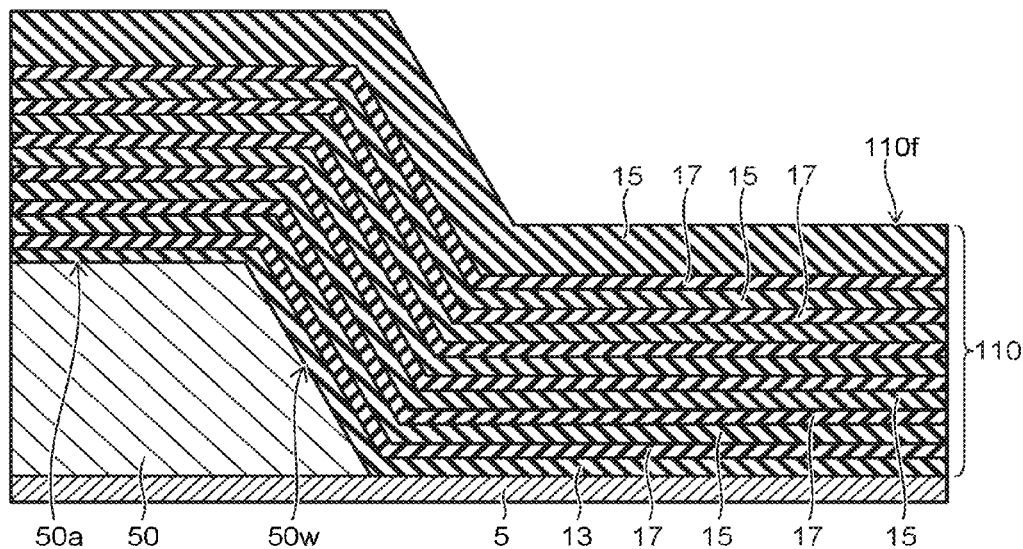
FIGS. 4A to 5H are schematic cross-sectional views showing a manufacturing process of the semiconductor memory device according to the first embodiment.

As shown in FIG. 4A, a support body 50 is formed on a substrate 5. Then, a stacked body 110 including an insulating layer 13, a plurality of insulating layers 15, and a plurality of insulating layers 17 is formed so as to cover the surface of the substrate 5 and the surface of the support body 50. The insulating layers 15 and 17 are stacked alternately on the insulating layer 13. The insulating layer 13, 15 is, for example, a silicon oxide layer. The insulating layer 17 is, for example, a silicon nitride layer. The insulating layers 13, 15, and 17 are formed, for example, using CVD (chemical vapor deposition).

The support body 50 has a sidewall 50w inclined toward the Z-direction from the surface of the substrate 5. The insulating layers 13, 15, and 17 each have a portion formed along the sidewall 50w. The sidewall 50w extends, for example, in the Y-direction.

Figure 4B:
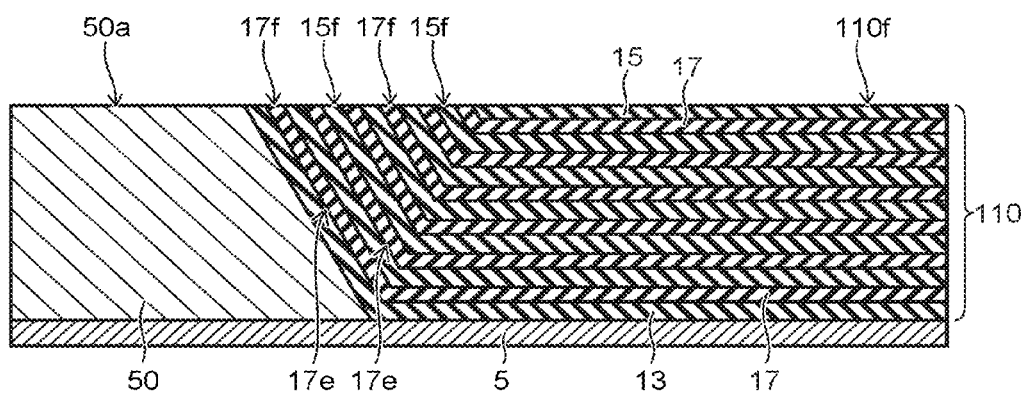

As shown in FIG. 4B, the portion of the stacked body 110 formed at the level above the upper surface 50a of the support body 50 is removed to planarize the upper surface 110f of the stacked body 110. For instance, CMP (chemical mechanical polishing) is used to planarize the upper surface 110f of the stacked body 110. Thus, the upper surface 50a of the support body 50 is exposed. Accordingly, the end surface 15f of the insulating layer 15 and the end surface 17f of the insulating layer 17 are exposed in the upper surface 110f of the stacked body 110. The upper surface 50a of the support body 50 is positioned at the same level as the upper surface 110f of the stacked body 110.

Figure 4C:
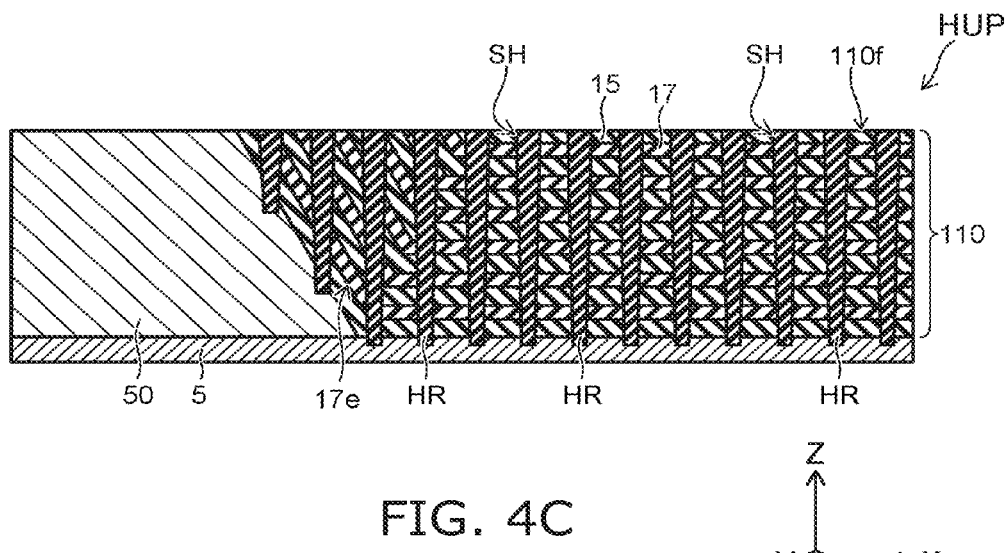

As shown in FIG. 4C, columnar support bodies HR are formed. The columnar support bodies HR extend through the insulating layers 13, 15, and 17, and extend from the upper surface 110f of the stacked body 110 to the substrate 5. The columnar support bodies HR are formed, for example, by forming a through hole SH in the Z-direction through the stacked body 110 and then, burying silicon oxide therein. In the memory cell portion MCP, memory holes penetrating through the stacked body 110 in the Z-direction are formed, and columnar bodies CL are formed therein before or after this process, or simultaneously with columnar support bodies HR.

Figure 4D:
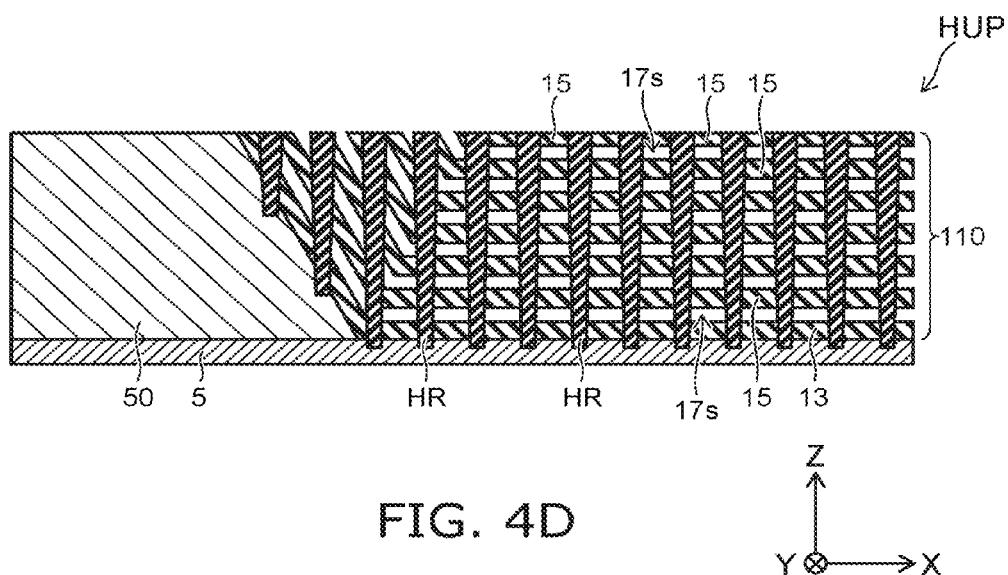

As shown in FIG. 4D, spaces 17s are formed in the stacked body 110 by selectively removing the insulating layers 17. The insulating layers 17 are removed, for example, by wet etching supplying an etching liquid through the slits ST (see FIG. 1) that divides the stacked body 110. In the case where the insulating layers 17 are silicon nitride layers, the insulating layers 17 can be selectively removed, for example, by using e.g. hot phosphoric acid solution while leaving the insulating layers 13 and 15. The columnar support bodies HR support the insulating layers 15 and the spaces 17s.

Figure 4E:
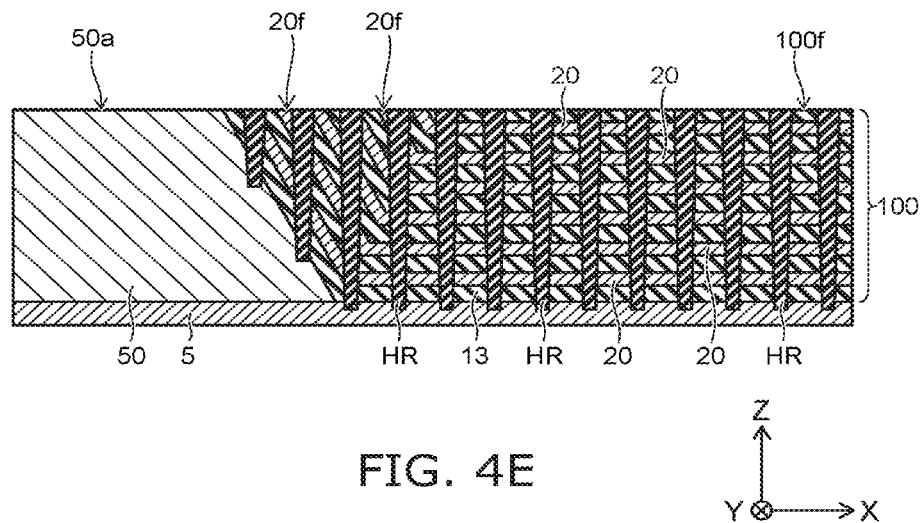

As shown in FIG. 4E, the electrode layers 20 are formed in the spaces 17s (see FIG. 4D) formed by removing the insulating layers 17 to complete the stacked body 100. The electrode layers 20 are, for example, a metal layer formed in the spaces 17s using CVD. The electrode layers 20 have a structure in which a barrier metal layer and a high-melting-point metal layer such as tungsten are sequentially stacked, for example. The barrier metal layer is, for example, titanium nitride (TiN). The barrier metal layer is formed between the insulating layer 15 and the high-melting-point metal layer and between the columnar support part HR and the high-melting-point metal layer. The end surfaces 20f of the electrode layers 20 are exposed in the upper surface 100f of the stacked body 100.

Figure 4F:
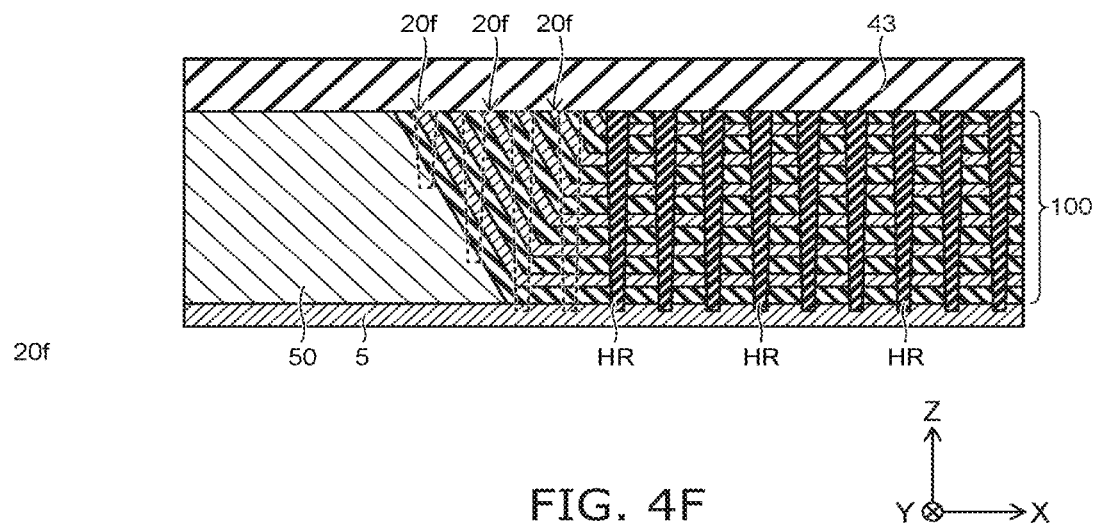

As shown in FIG. 4F, an insulating layer 43 is formed so as to cover the upper surface 100f of the stacked body 100 and the upper surface 50a of the support body 50. The insulating layer 43 is, for example, a silicon oxide layer formed using CVD.

Figure 5A:
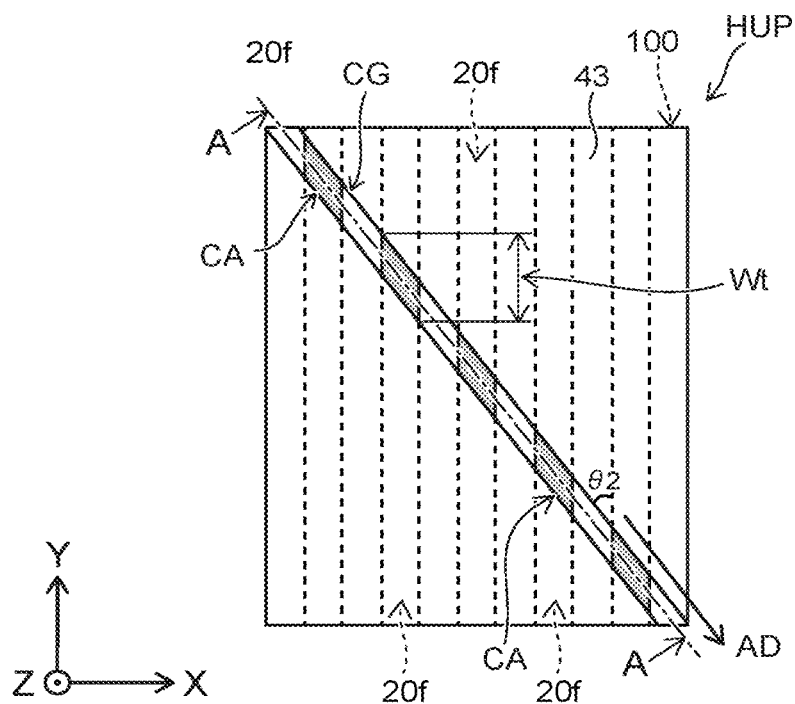
Figure 5B:
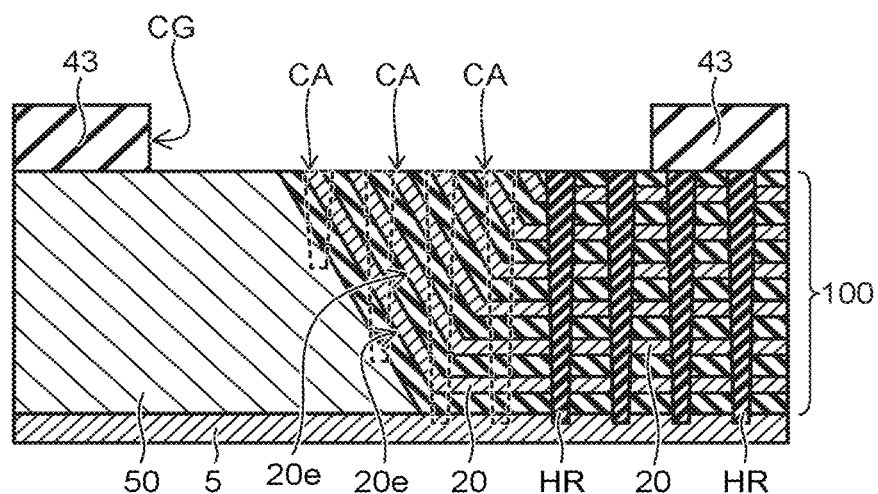

FIG. 5A is a schematic view showing the surface of the insulating layer 43 in the hook-up portion HUP. FIG. 5B is a schematic view showing a cross section taken along the line A-A shown in FIG. 5A. A similar cross section is shown in FIGS. 5C to 5H.

As shown in FIG. 5A, a contact groove CG is formed in the insulating layer 43. The contact groove CG extends in the AD-direction crossing the X-direction and the Y-direction. On the other hand, the end surface 20f of each electrode layer 20 extends in the Y-direction. Thus, a part of the end surface 20f of each electrode layer 20 is exposed as the contact area CA at the bottom surface of the contact groove CG. That is, it is possible to expose the contact area CA of each electrode layer 20 at the bottom surface of the contact groove CG as shown in FIG. 5B.

For instance, in the manufacturing process of the stacked body 100, the insulating layers 15 and 17 may have thicknesses changing along the surface of the substrate 5. The thicknesses of the insulating layers 15 and 17 may include a deviation from each designed value. Such a change in layer thickness leads to width and positional variations of the end surfaces 20f of the electrode layers 20 in the X-direction. These variations relatively increase as the layer thicknesses of the insulating layers 15 and 17 are shrunk for the miniaturization of the memory cell portion MCP. This makes it difficult in photolithography to form a contact hole that is in communication with each end surface 20f of the electrode layer 20.

In contrast, a contact groove CG extending in the AD-direction is formed in this embodiment. The AD-direction crosses the extending direction of the end surfaces 20f of the electrodes layer 20 (e.g. Y-direction). Thus, parts of the end surfaces 20f are exposed at the bottom surface of the contact groove CG. This makes it possible to provide the contact area CA in each electrode layer 20.

For example, the end surface 20f and the contact groove CG are preferably formed to have the crossing angle of 45 degrees or less therebetween. This makes it possible to enlarge the tolerance Wt in the alignment of the gate interconnection GL (see FIG. 3). For instance, due to the variation in the layer thickness of the insulating layers 15 and 17, the position of the contact area CA is shifted along the extending direction of the contact groove CG (AD-direction). Thus, the alignment of the gate interconnections GL under the enlarged tolerance Wt may become easier in spite of such a shift.

Furthermore, in this embodiment, conductive layers 70 that serve as contact plugs Cg are formed in a self-aligned manner on the contact areas CA. Thus, the electrical connection between an electrode layer 20 and a gate interconnection GL becomes easy. Hereinbelow, a method for forming an hook-up structure for the electrical connections of the electrode layers 20 and the gate interconnections GL is described with reference to FIGS. 5C to 5H.

Figure 5C:
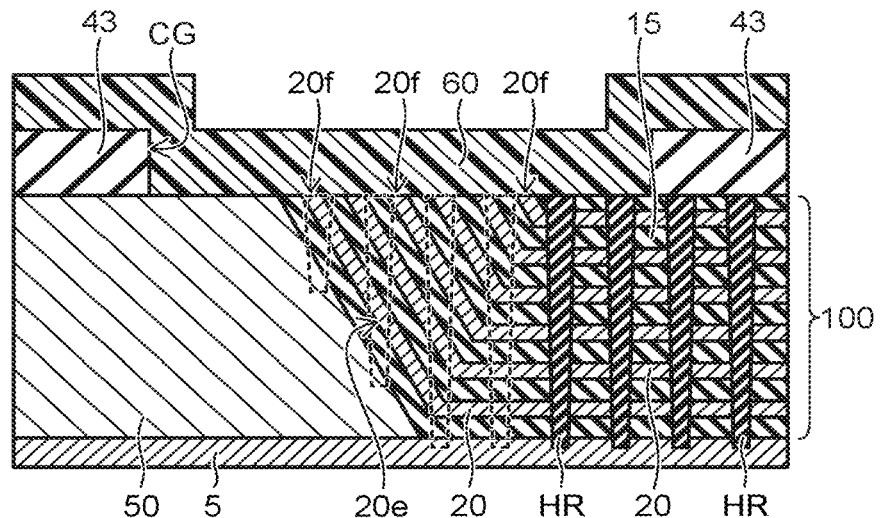

As shown in FIG. 5C, a block copolymer is applied into the contact groove CG and on the insulating layer 43 to form a polymer film 60, the block copolymer containing hydrophilic polymer and hydrophobic polymer. Then, the polymer film 60 is heated to form a phase separation structure. For instance, the hydrophilic polymer aggregates on the contact area CA. The hydrophobic polymer aggregates on the end surface of the insulating layer 15 and the surface of the insulating layer 43. Thus, the phase separation structure is formed in such a manner.

Figure 5D:
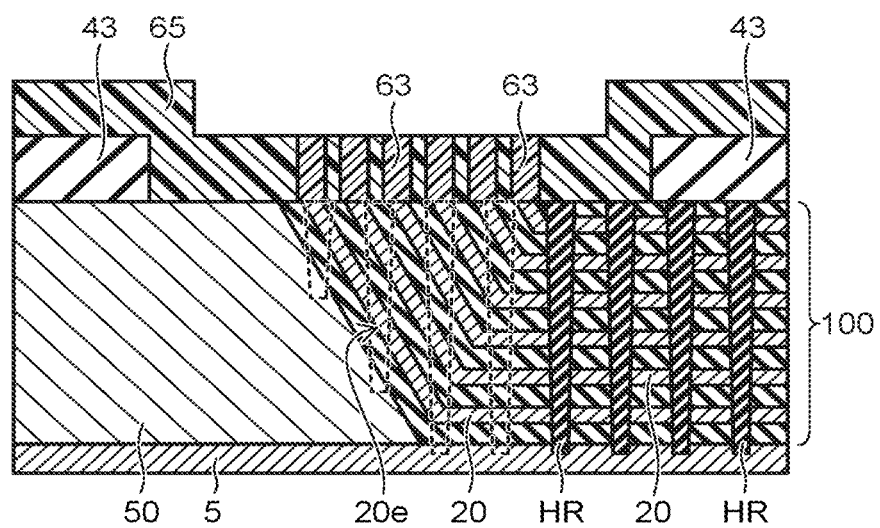

As shown in FIG. 5D, the polymer film 60 includes a first portion 63 on the contact area CA and a second portion 65 other than the first portion 63. The first portion 63 and the second portion 65 are phase-separated from each other. The first portion 63 contains e.g. PMMA (polymethyl methacrylate). The second portion 65 contains e.g. polystyrene.

Figure 5E:
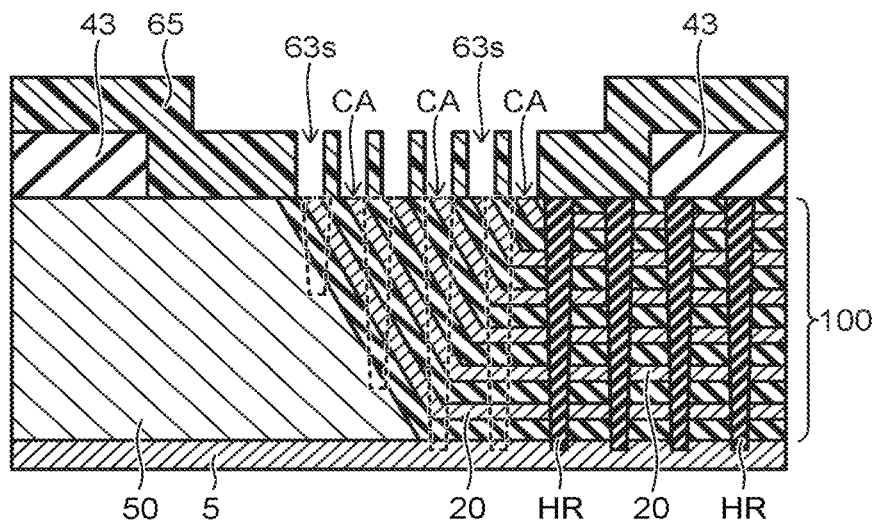

As shown in FIG. 5E, the first portion is selectively removed to form a space 63s in the polymer film 60. The contact area CA is exposed at the bottom surface of the space 63s.

Figure 5F:
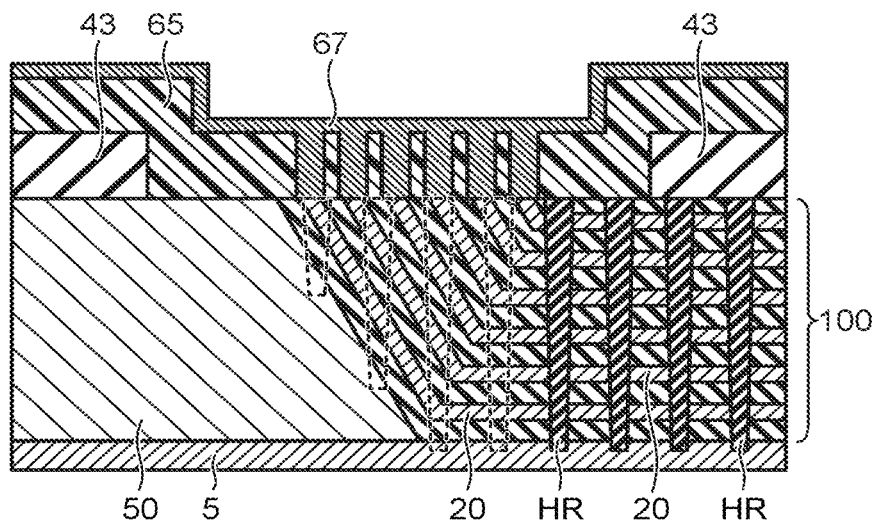

As shown in FIG. 5F, a metal layer 67 is formed so as to cover the surface of the polymer film 60 and to be buried in the space 63s. The metal layer 67 contains e.g. tungsten (W) or copper (Cu).

Figure 5G:
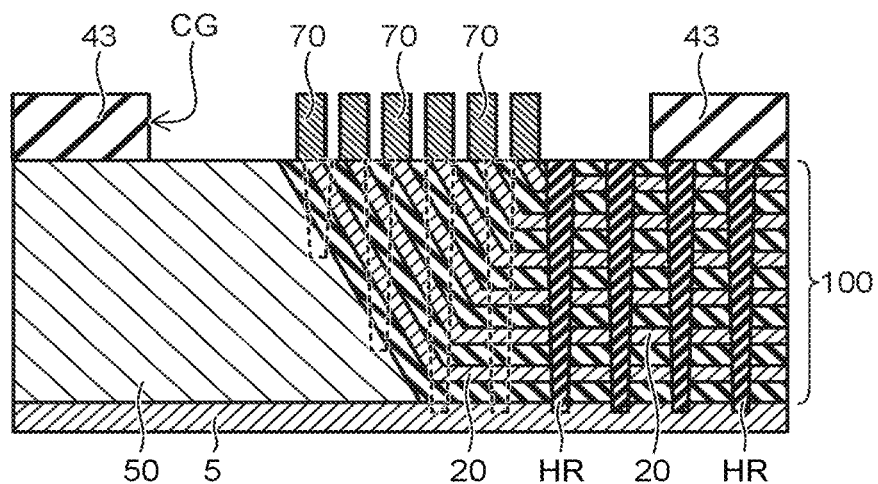

Then, the metal layer 67 formed on the upper surface of the polymer film 60 is removed, for example, using dry etching. Furthermore, the polymer film 60 is selectively removed, for example, by ashing. Thus, a conductive layer 70 is formed in a self-aligned manner on the contact area CA as shown in FIG. 5G.

Figure 5H:
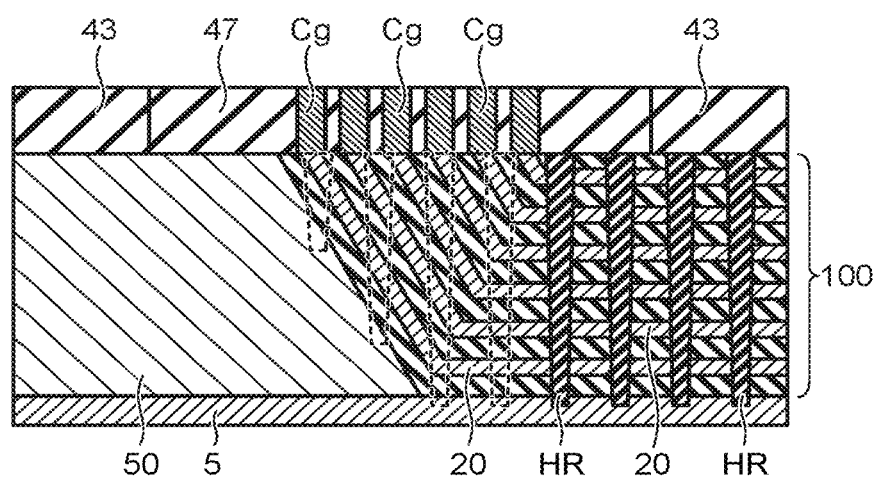

As shown in FIG. 5H, an insulating layer 47 is formed to be buried in the contact groove CG. The insulating layer 47 is e.g. a silicon oxide layer. For instance, an insulating layer 47 is formed using CVD so as to cover the surface of the insulating layer 43 and to be buried in the contact groove CG. Then, the insulating layer 47 is etched back to expose the upper end of the conductive layer 70. Thus, a plurality of contact plugs Cg are formed, which is electrically connected to the respective electrode layers 20.

Furthermore, a gate interconnection GL electrically connected to each contact plug Cg is formed on the insulating layer 43 (see FIG. 2B). Thus, the hook-up structure that electrically connects the stacked electrode layers 20 and the gate interconnections GL is easily formed in the embodiment. The hook-up structure above is simple and makes it easy to reduce the area of the hook-up portion HUP. This may enlarges the size of memory cell portion MCP, and thus, the memory capacity of the semiconductor memory device 1 is enlarged.

Figure 6A:
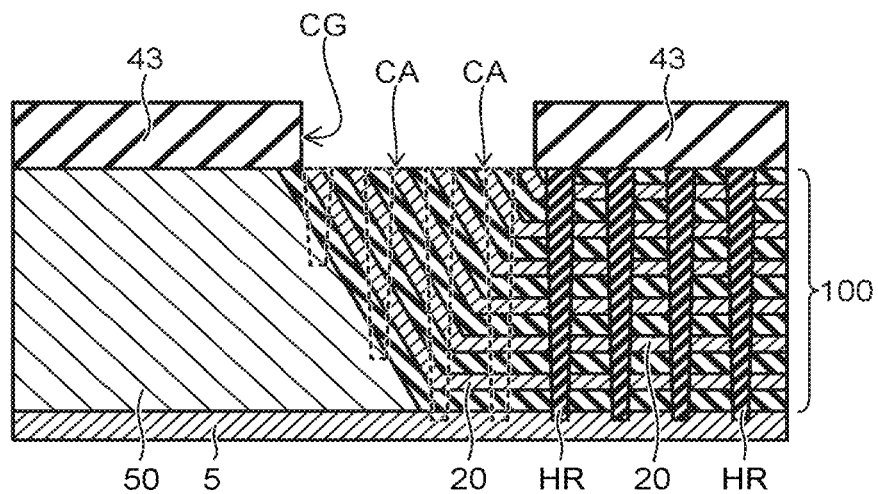
FIGS. 6A and 6B are schematic cross-sectional views showing a manufacturing process of a semiconductor memory device according to a variation of the first embodiment.
Figure 6B:
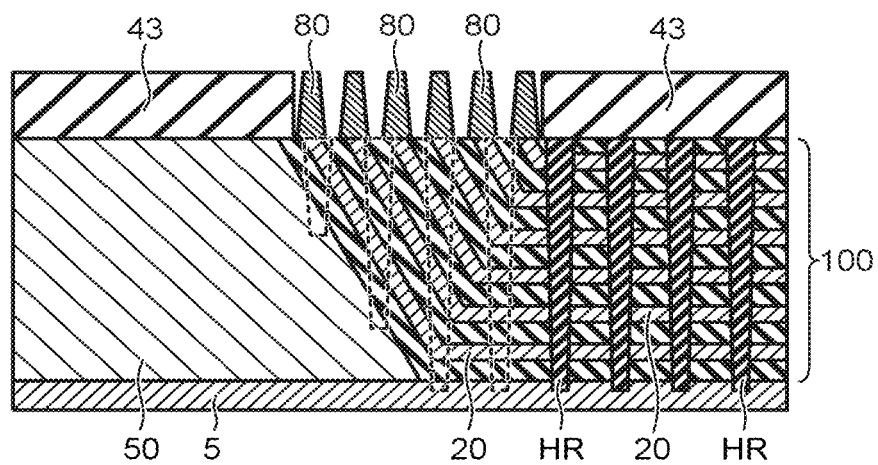

FIGS. 6A and 6B are schematic sectional views showing a manufacturing method according to a variation of the first embodiment. In this example, after forming a contact groove CG in the insulating layer 43 as shown in FIG. 6A, a conductive layer 80 is formed on the contact area CA at the bottom surface of the contact groove CG using the electroless plating technique.

As shown in FIG. 6B, the conductive layer 80 is selectively formed on the end surface 20f (contact area CA) of the electrode layer 20 exposed at the bottom surface of the contact groove CG. At this time, the electroless plating time is preferably controlled so that conductive layers 80 adjacent in the AD-direction are not in contact with each other. The conductive layer 80 contains e.g. copper or nickel.

Furthermore, an insulating layer 47 is formed, which is buried in the contact groove CG. The conductive layer 80 serves as a contact plug Cg (see FIG. 5H). Thus, electroless plating technique may also be used to form a contact plug Cg in a self-aligned manner.

Second Embodiment

Figure 7A:
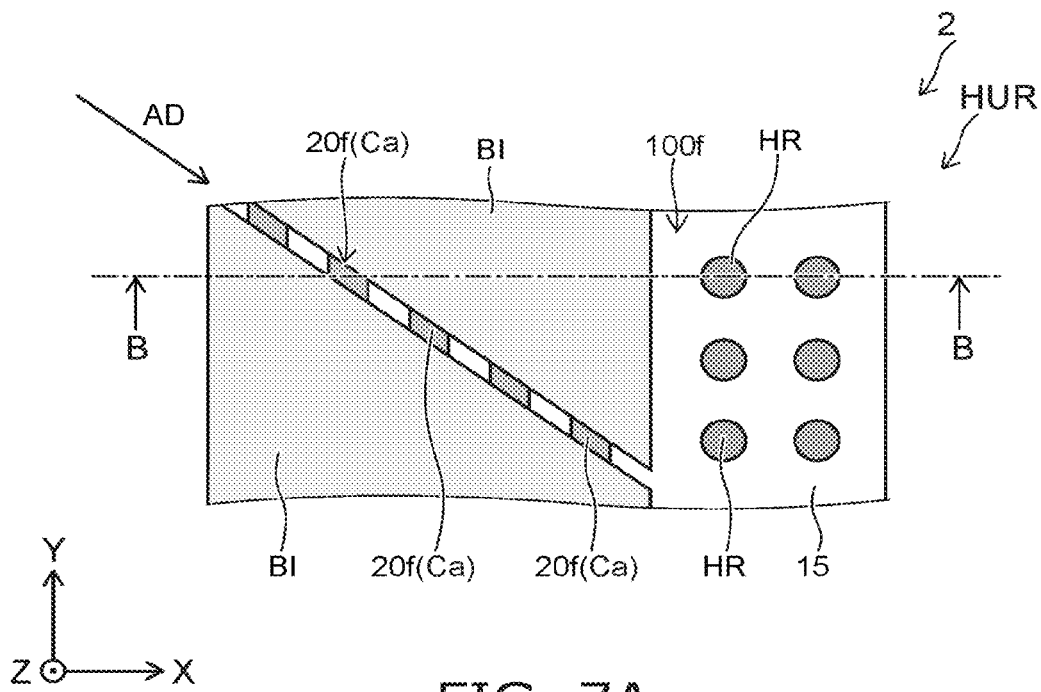
FIGS. 7A to 8B are schematic views showing a hook-up portion of a semiconductor memory device according to a second embodiment.
Figure 7B:
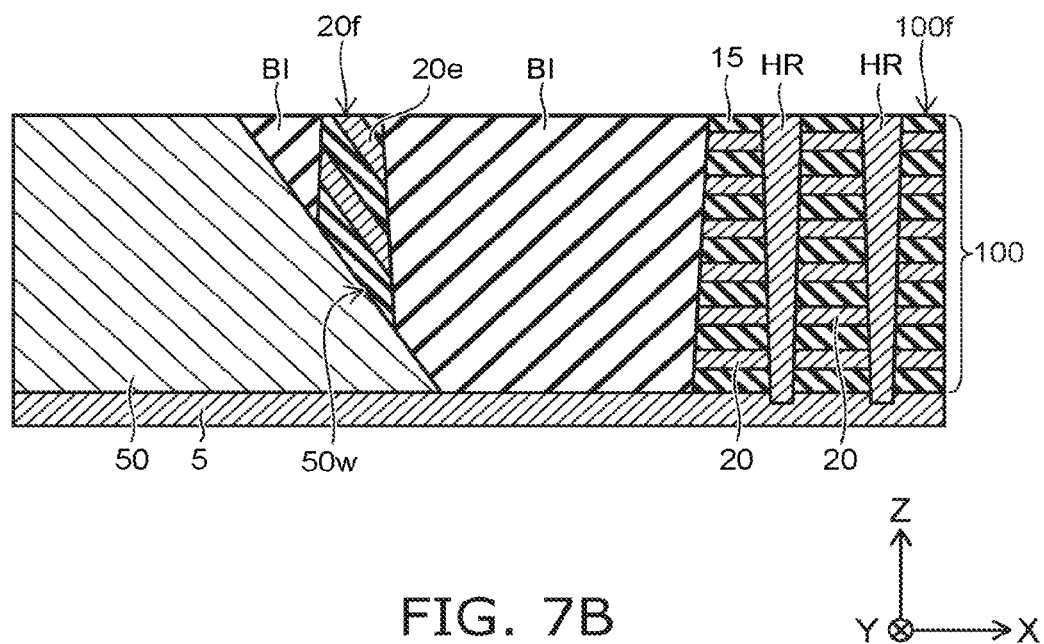
Figure 8A:
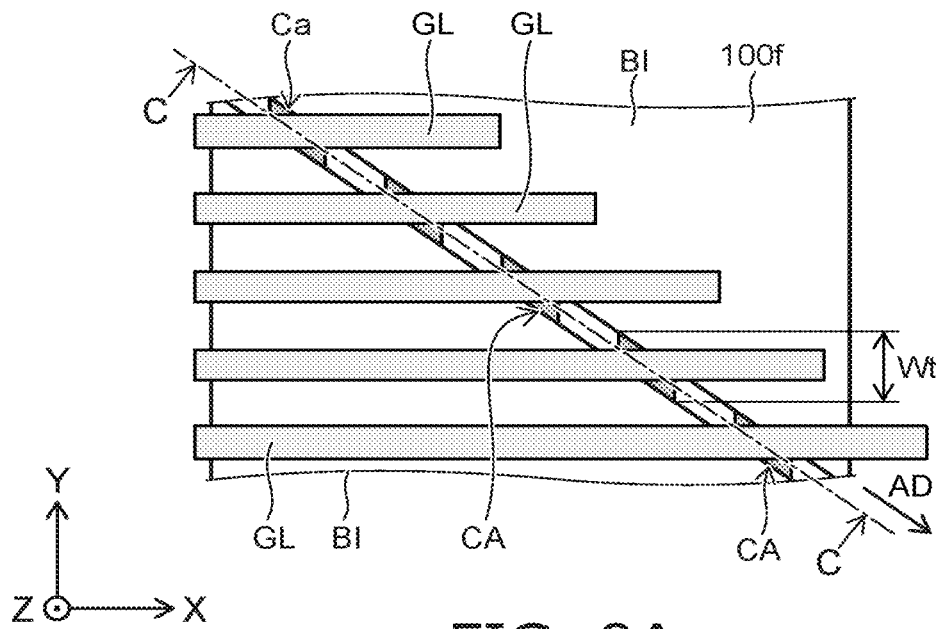
Figure 8B:
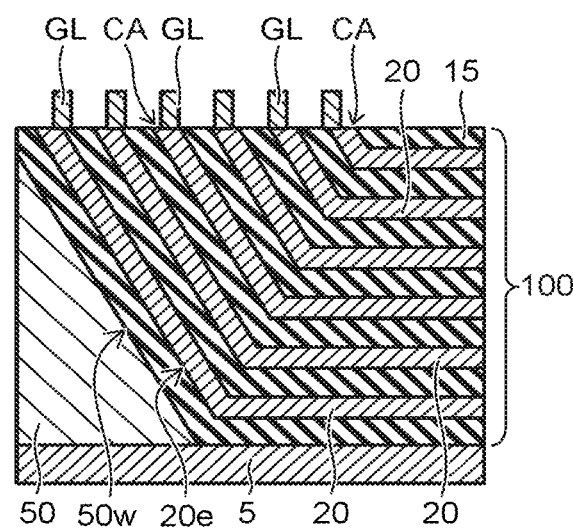

FIGS. 7A to 8B are schematic views showing a semiconductor memory device 2 according to a second embodiment. FIGS. 7A and 8A are schematic views showing the upper surface 100f of the stacked body 100 in the hook-up portion HUP. FIG. 7B is a schematic view showing a cross section taken along the line B-B shown in FIG. 7A. FIG. 8B is a schematic view showing a cross section taken along the line C-C shown in FIG. 8A. FIG. 8B is a view showing a cross section taken along the AD-direction.

As shown in FIGS. 7A and 7B, the semiconductor memory device 2 includes columnar support bodies HR and a buried layer BI in the hook-up portion HUP. The columnar support bodies HR and the buried layer BI are provided with a depth from the upper surface 100f of the stacked body 100 to the substrate 5. The columnar support bodies HR and the buried layer BI are, for example, insulating bodies containing silicon oxide.

In the top view shown in FIG. 7A, the end parts 20e of the electrode layers 20 are provided so as to extend in the AD-direction between the buried layers BI. As shown in FIG. 7B, the end parts 20e of the electrode layers 20 are provided obliquely along the sidewall 50w of the support body 50. The end surfaces 20f of the electrode layers 20 are exposed at the upper surface 100f of the stacked body 100. The end surfaces 20f are arranged in the AD-direction crossing the X-direction and the Y-direction in the upper surface 100f of the stacked body 100. The end surfaces 20f act as the contact areas CA of the electrode layers 20. As shown in FIG. 7A, the end surfaces 20f each have a parallelogram shape, for example. Each of the contact areas CA has a boundary along the AD-direction.

FIG. 8A is a schematic view showing the gate interconnections GL provided on the upper surface 100f of the stacked body 100. In this example, the gate interconnections GL are formed directly on the upper surface 100f of the stacked body 100. The gate interconnections GL are electrically connected to the electrode layers 20 respectively through the contact areas CA. The positional variation of the contact areas CA may be absorbed by the Y-direction tolerance Wt of the contact area CA to make the alignment of the gate interconnections GL easy.

As shown in FIG. 8B, the electrode layers 20 are electrically connected to the gate interconnections GL respectively through the end parts 20e that are inclined along the sidewall 50w of the support body 50. Thus, the gate interconnections GL are electrically connected to the stacked electrode layers 20 respectively by a simple structure in the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, the device comprising:
    a stacked body including a first electrode layer and a second electrode layer stacked on the first electrode layer, the stacked body having a first surface crossing a stacked direction toward the second electrode layer from the first electrode layer, wherein the first electrode layer having a first end surface in the first surface, and the second electrode layer having a second end surface in the first surface;
    a semiconductor layer extending through the stacked body in the stacked direction;
    a first interconnection electrically connected to the first electrode layer through a first region provided in the first end surface; and
    a second interconnection electrically connected to the second electrode layer through a second region provided in the second end surface,
    the first and second interconnections extending in a first direction on the first surface; the first region and the second region being arranged in a second direction crossing the first direction with a crossing angle smaller than 90 degrees; and the first region and the second region each having a boundary along the second direction.

2. The device according to claim 1, wherein the first electrode layer and the second electrode layer have an end portion inclined with respect to the stacked direction.

3. The device according to claim 1, wherein the first end surface and the second end surface extend in a third direction crossing the first direction and the second direction in the first surface.

4. The device according to claim 3, wherein each of the first region and the second region further has a boundary along the third direction.

5. The device according to claim 1, further comprising:
    a first insulating layer provided on the stacked body, wherein the first region and the second region are a part of the first end surface and a part of the second end surface exposed at a bottom surface of a groove provided in the first insulating layer and extending in the second direction.

6. The device according to claim 1, further comprising:
    a first conductive body provided on the first region; and
    a second conductive body provided on the second region,
    wherein the first interconnection is electrically connected to the first electrode layer through the first conductive body, and
    the second interconnection is electrically connected to the second electrode layer through the second conductive body.

7. The device according to claim 1, further comprising:
    an underlying layer adjacent to the first electrode layer on a side of the stacked body opposite to the first surface; and
    a support body provided on the underlying layer, a part of the support body being positioned between the underlying layer and an end portion of the first electrode layer,
    wherein the support body has a sidewall inclined with respect to the stacked direction, and
    the end portion of the first electrode layer extends along the sidewall.

8. The device according to claim 7, wherein
    the support body has a first surface on a side opposite to the underlying layer, and
    the first surface of the stacked body is positioned at a same level as the first surface of the support body.

9. The device according to claim 7, wherein the first interconnection and the second interconnection extend in the first direction on the support body.

10. The device according to claim 1, further comprising:
    a first insulating body extending in the stacked direction through the stacked body.

11. The device according to claim 1, wherein the first region and the second region each have a parallelogram like shape.

12. The device according to claim 1, further comprising:
    second insulating bodies provided along the second direction on both sides of the first region and the second region.

13. The device according to claim 12, wherein
    no portion of the stacked body lies under the second insulating bodies.

* * * * *